United States Patent
Houston

(10) Patent No.: US 6,552,923 B2
(45) Date of Patent: Apr. 22, 2003

(54) SRAM WITH WRITE-BACK ON READ

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/877,534

(22) Filed: Jun. 8, 2001

(65) Prior Publication Data

US 2001/0052624 A1 Dec. 20, 2001

Related U.S. Application Data

(60) Provisional application No. 60/211,259, filed on Jun. 13, 2000.

(51) Int. Cl.[7] .............................................. G11C 11/00
(52) U.S. Cl. ........................ 365/154; 365/156; 365/205; 365/189.01
(58) Field of Search ................................ 365/154, 156, 365/190, 189.03, 189.09, 230.06, 205, 189.01

(56) References Cited

U.S. PATENT DOCUMENTS

| | | | | |
|---|---|---|---|---|
| 4,623,989 A | * | 11/1986 | Blake | 365/156 |
| 5,881,010 A | * | 3/1999 | Artieri | 365/222 |
| 5,999,474 A | * | 12/1999 | Leung et al. | 365/222 |
| 6,285,578 B1 | * | 9/2001 | Huang | 365/154 |
| 6,442,060 B1 | * | 8/2002 | Leung et al. | 365/154 |

* cited by examiner

Primary Examiner—David Lam
(74) Attorney, Agent, or Firm—Peter K. McLarty; W. James Brady, III; Frederick J. Telecky, Jr.

(57) ABSTRACT

A data storage cell that is stable on standby but upsets on read. Standby stability is achieved without read and restore. In one embodiment, the leakage current is balanced by manipulating the transistor widths and lengths, making the subthreshold current of the pass transistor greater than that of the drive transistor. A write-back during the read cycle compensates for the read upset.

6 Claims, 6 Drawing Sheets

SRAM WITH WRITE-BACK ON READ

This application claims priority under 35 USC §119(e)(1) of provisional application Ser. No. 60/211,259, filed Jun. 13, 2000.

BACKGROUND AND SUMMARY OF THE INVENTION

The present invention relates to data storage, and more specifically to RAM storage cells.

Many different types of data storage are used in various parts of a computer system. Non-volatile memory retains its data even when power is not applied. Volatile memory requires energy to retain its data. Two types of volatile memory are static and dynamic random-access memory (RAM).

RAM data storage is memory in which any cell can be randomly accessed for read and write by inputting the coordinates of that cell on the address pin. Basic RAM architecture can include inputs, outputs, addresses, read control, write control, and data storage. The basic cell stores two well defined states in a repeatedly accessible location.

Capacitors and latches are commonly used as RAM storage cells. These types of storage are susceptible to instability under certain circumstances, namely on read (when the stored data is accessed) and on standby (when the stored data is not being accessed).

Background: Standby Instability

Cells that use capacitors are normally unstable on standby, since charge stored in capacitors tends to leak away with time. The data stored in capacitors must therefore be periodically refreshed. Refreshing data consists sensing the state stored in the cell (1 or 0) and writing that state back to the cell, thus restoring the memory cell to its original state. Periodic refresh is a source of power consumption in standby. Storage cells that store charge on a capacitor and require refresh are termed dynamic RAM, or DRAM.

In addition to requiring periodic refresh, the sensing or reading of information in a DRAM cell upsets the storage state, destroying the stored information. The information must be restored to the cell (usually by writing the state back into the cell) within the read cycle.

Latches use bistable flipflops to store data. Typical storage cells are shown in FIGS. 1a–1c. FIG. 1a shows a 6T SRAM cell with PMOS load devices. Data are stored as voltage levels with the two sides of the flipflop in opposite voltage states. The load devices offset charge leakage at the drains of the driver and access transistors. FIG. 1b shows a similar cell that uses resistors rather than transistors. This permits reduction in cell size because the resistors can be stacked on top of the cell, but also has higher leakage in standby, trading performance for cost. FIG. 1c shows a standard 4T SRAM storage cell. This cell uses two PMOS transistors as pass transistors and two NMOS transistors as drive transistors.

Data storage will be discussed with reference to FIG. 1c. The storage states are determined by the relative potential between the two nodes, A and B. When node A is high, transistor 102 conducts, which grounds node B. Grounding node B turns off transistor 104, which maintains the high potential at A.

Transistors experience leakage due to subthreshold currents even when the transistor is off. To maintain high node voltage, the on p-channel transistor (6T cell), resistor (4T-2R cell), or subthreshold current of the pass transistor (4T cell) must be enough to counter the subthreshold current of the off n-channel drive transistor plus any other leakage current at that node. For the 4T cell, it may be necessary to lower the wordline voltage. This will maintain the stored high voltage state by increasing the p-channel pass gate transistor subthreshold current. It is desirable to minimize the current required to maintain the stored voltage state. For DRAM, where the stored voltage is maintained by charge stored on a capacitor, the leakage or subthreshold currents limit the time for which the stored voltage can be maintained. The DRAM cell must therefore be periodically refreshed through a read and write-back to the cell.

Background: Read Instability

A bit stored in a memory cell is accessed by its row and column address. FIG. 2 shows a RAM storage architecture. The row decoder 202 selects a row address from the N rows. All M cells on that row, or wordline, are activated. The column decoder 204 then selects a subset of the M bits for output. There may be one sense amp per column, and the column select chooses from the output of the M sense amps. Alternatively, there may be fewer sense amps than columns, and the column decode selects which columns are to be connected to the sense amps. If there is more than one sense amp, the column select may further select among the outputs of the multiple sense amps. In FIG. 2, the sense amplifier 208 detects the voltage differential between the two bitlines of the selected column, amplifies this voltage difference, and sends the data out of the array. A read-write control circuit 206 controls Input and Output.

In a cell with PMOS pass transistors, the wordlines are maintained high to keep the cell isolated from the bitline. Keeping the wordline high keeps the PMOS transistor from conducting. When a wordline is accessed, its voltage is lowered, which turns on the pass transistors. This connects all cells in that wordline to the associated bitlines. PMOS pass transistors 106, 108 are shown in FIG. 1c.

The state of every cell on that wordline is potentially disturbed at this point because of the precharge on the bitlines. Referring back to FIG. 1c, assume that node B is in a low potential state, and node A is high. If the bitlines are precharged high, the low side of the storage cell must pull that bitline low to establish a differential voltage on the bitlines for detection. At the same time, the charge on the bitline will tend to pull node B high.

In a perfectly balanced case, a differential voltage between node A and node B will be maintained and the memory state will be retained. However, if there are asymmetries in the cell that prefer the state where node A is low, the memory cell may be upset when accessed. The amount of asymmetry that can be tolerated without upset of the memory cell when accessed is referred to as the noise margin. The magnitude of the noise margin is affected by the strength (drive current capacity) of the drive transistor relative to the strength of the pass transistor in the memory cell. The stronger the drive transistor relative to the pass transistor, the greater the noise margin.

It should be noted that even if the memory is upset on access, there will be an initial differential voltage imposed on the bitlines reflecting the original state of the accessed memory cell. One design criterion for SRAM cells has been that they have sufficient noise margin to not upset on access for anticipated ranges of asymmetry at expected operating conditions. In contrast, memory is expected to be lost on access of DRAM cells. For DRAM cells the initial voltage imposed on the bitline is detected. The detected state of the accessed memory cell is subsequently written back into the accessed cell, restoring the original state.

Background: Cell Beta

Many important features in a memory cell depend at least in part on the dimensions of the transistors. A transistor is formed on a chip wherever a polysilicon path crosses a diffusion path, as shown in FIG. 3. The leakage or off-state current of a transistor is proportional to W. The leakage current dependence on L is more complex, but generally leakage decreases with increases of L from the minimum design values. Thus the ratio of W to L determines both the drive and off-state capacity of the transistor. As this ratio increases (i.e., as W increases or as L decreases), the drive capacity increases. This ratio is referred to as W/L.

In SRAM storage cells, the operation and stability of the cell in standby and on read is influenced by these ratios. The ratio between the drive capacity of the drive transistors to the drive capacity of the pass transistors is called the cell beta. For the 4T cell, if cell beta is designed to be high (i.e., the drive transistors have greater drive and leakage current capacity than the pass transistors), then the cell will be unstable on standby, but stable on read. Conversely, if the 4T cell beta is designed to be low (meaning the drive transistors have less drive and leakage capacity than the pass transistors) then standby stability is achieved, and read stability is lowered.

The possibility of upset on read is an increasing problem with scaling as threshold voltages are lowered and as exact matching of the transistors becomes more difficult. As device sizes are scaled down, the amount of dopant within the transistor volume decreases. As doping decreases, the margin of error decreases, since a small variation in the number of doping atoms becomes more significant.

For a 6T cell, there is a similar memory trade-off of noise margin, trip voltage, and read current. For a given cell area, increasing the noise margin requires lowering the read current or making the write more difficult, or both.

Instability on read and standby causes conflicting design considerations in RAM storage. Various approaches balancing these considerations have been used. For instance, a four transistor (4T) SRAM cell disclosed by NEC Corporation uses a flipflop and two p-channel pass transistors. The n-channel drive transistors are given a higher threshold voltage to ensure the subthreshold current for the drive transistor is less than that of the pass transistors. This results in standby stability and read stability (at sufficiently high operating voltage), but with reduced noise margin and increased process cost (namely a $V_T$ implant). The size of $V_T$ in this approach is limited because of the requirement of read stability. The requirement of read stability also limits the minimum value for storage voltage. Other proposed designs do away with the $V_T$ implant, and instead lower the wordline voltage during standby to maintain the memory state. This relaxes the requirements on pass and drive transistors, allowing them to be better optimized for noise margin, but with greater power dissipation on standby. A lowering of all wordlines during a portion of the active cycle may also be required to maintain memory. There is thus a need in the art for a memory cell that uses standard processes, has low voltage operation, and that couples low standby current with stability in standby.

SRAM with Write-Back on Read

The present application discloses a memory system that is stable on standby but may upset on read. Read stability is sacrificed to get standby stability. This trade is advantageous because it minimizes power requirements on standby. The memory system includes a write-back in the read cycle to compensate for the read instability.

Even when the SRAM cell is upset on read, the cell imposes an initial differential on the bitlines in accordance with the stored data. This initial differential will be lost after the cell upsets. The innovative memory system senses the stored state even though the cell is subject to upset and writes that state back to the cell during or immediately after the read cycle.

When implemented with a 4T cell, the balance of the leakage current can be improved by design of the W/L ratios of the pass and drive transistors. The pass transistors are made wider and shorter than the drive transistors, which increases the subthreshold current of the pass transistor relative to that of the drive transistor. This decreases beta and makes the cell more stable in standby, but less stable on read.

The sacrifice of read stability also raises the trip voltage (the voltage that must be obtained on the bitlines to write into the cell). This creates a greater write margin for the cell. Increased standby stability also allows a larger imbalance to exist in the cell and still maintain proper operation.

Another inventive aspect of the present application involves increasing standby stability by using a $V_T$ implant. Previous limits to the $V_{TN}$ because of read stability requirements are alleviated by incorporating a write-back. This also allows a lower storage voltage to be used.

When implemented with a 6T cell, the noise margin of the cell can be reduced to allow increased read current or to increase margin for writing into the cell.

The disclosed innovations, in various embodiments, provide one or more of at least the following advantages:

compact cell with standard process;
good operation at low voltage;
standby stability;
low standby current;
greater write margin.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment (by way of example, and not of limitation).

Figure 4:
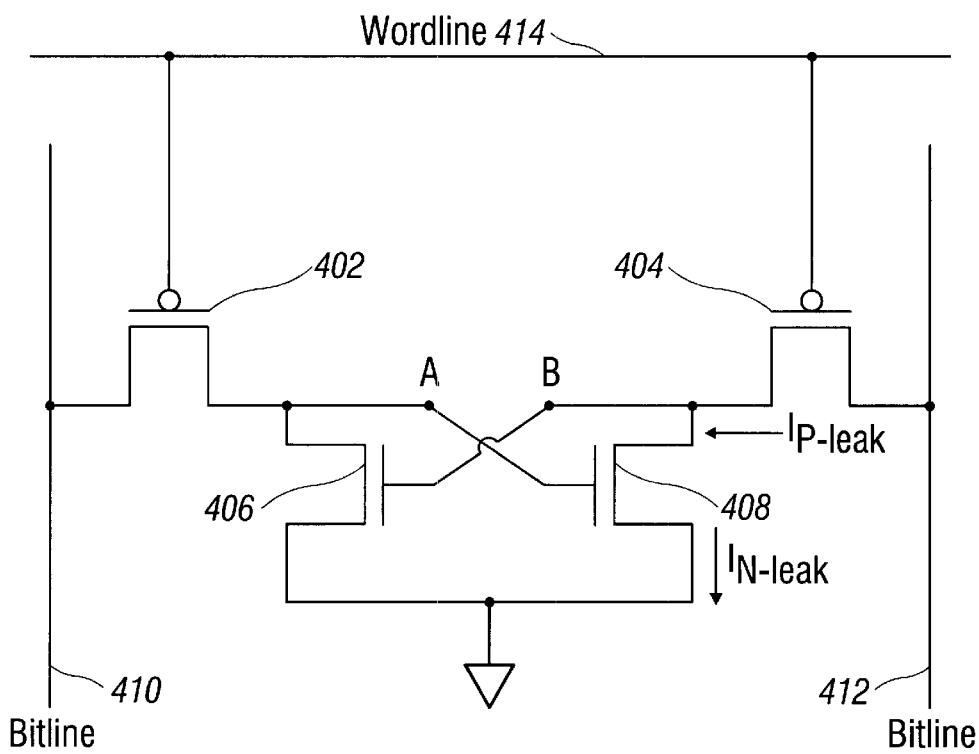
FIG. 4 shows a bistable flipflop storage cell used in the preferred embodiment.

FIG. 4 shows the preferred embodiment incorporating the present innovations. The W's, L's, and $V_T$'s of the transistors are designed so that the cell is stable on standby and provides a detectable differential on the bitlines prior to possible upset on read. (See FIGS. 9 and 10 for time frames for detecting the voltage differential.)

The presently disclosed innovative storage cell maintains its data on standby by balancing the leakage currents in the transistors. The transistor design should be such that the leakage currents into and out of the high side storage node balance with that node's voltage greater than the drive transistor's threshold voltage. The differential maintained between the low storage node's voltage and the high storage node's voltage must be enough to be sensed by the sense amp. The amount of differential required depends on many factors, including the sense amp characteristics, sense timing, and any asymmetries in the cell. A reasonable minimum is the threshold voltage of the n-channel drive transistor.

Giving up read stability decreases the voltage differential that must be maintained in the cell. If no writeback is used, and the cell must be stable on read, then a greater differential is required than would be required only for stability in standby. When the pass transistor is turned on, currents will pull the low side high during read. (Note that similar currents will pull the high side higher on read, but asymmetries in the cell may not equalize these effects, and the cell may be upset if there is insufficient differential between the two storage nodes at the start of read to overcome possible asymmetries in the cell.) Thus, the voltage differential that must be maintained for read is greater than that which is actually detectable by the sense amp if the cell must be read stable. With writeback, as in the present application, only a voltage that is sufficient for detection must be maintained during standby.

Referring to FIG. 4, the cell consists of two p-channel pass transistors 402, 404 and two n-channel drive transistors 406, 408. The bitlines 410, 412 are precharged high, and the wordline 414 is high in standby. In the standby cycle, the p-channel pass transistors 402, 404 are turned off and act as load elements. Standby stability is achieved by making the leakage current ($I_{P-leak}$) of the pass transistors 402, 404 greater than the leakage from the high node to the ground. This includes leakage current ($I_{N-leak}$) of the drive transistors 406, 408. This balances the leakage currents so that the same leakage current flows into the drains of the drive transistors 406, 408 as flows out of the drains while the high node is at a detectable level. This allows a high node level to be maintained in standby without a load resistor or other specialized circuitry.

This cell is made stable in standby by design of the dimensions of the n- and p-channels of the respective transistors and their threshold voltages. The W/L ratios of the transistors control the drive and off-state currents of the transistors. By reducing the W/L ratio of the drive transistor 406, 408 relative to the W/L ratio of the pass transistor 402, 404, the leakage current of the drive transistors 406, 408 is reduced relative to that of the pass transistors 402, 404. Thus, the W/L ratio of the pass transistors 402, 404 must be large compared to the W/L ratio of the drive transistors 406, 408 for comparable $V_T$'s.

Standby stability can also be achieved by increasing the threshold voltage of the drive transistors 406, 408 relative to the pass transistors 402, 404 using a $V_T$ implant. Read stability is not a problem because the design incorporates a write-back during the read cycle. This allows a lower storage voltage to be used, which further decreases standby power consumption.

Figure 5:
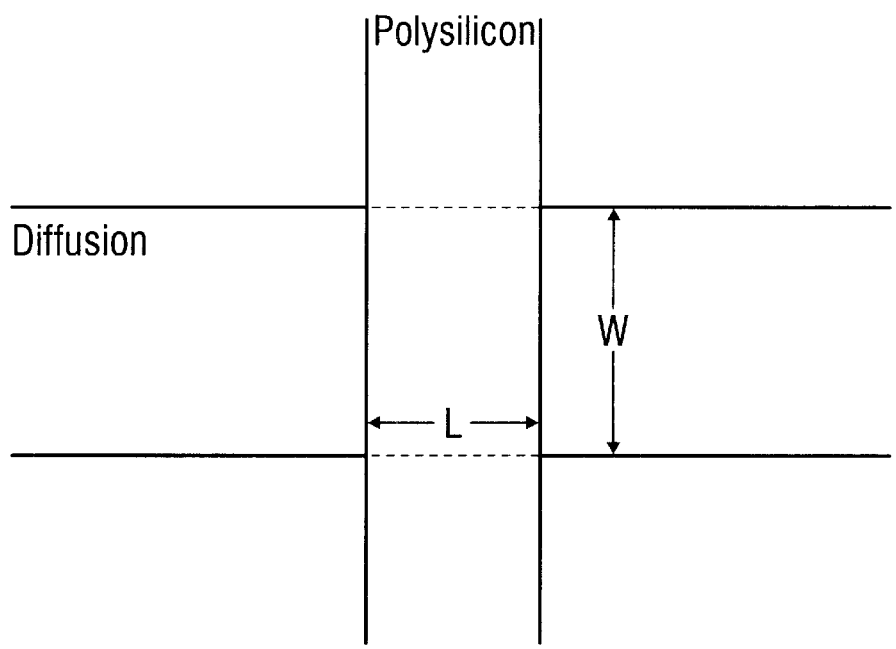
FIG. 5 shows design parameters of the pass transistors of the preferred embodiment.
Figure 6:
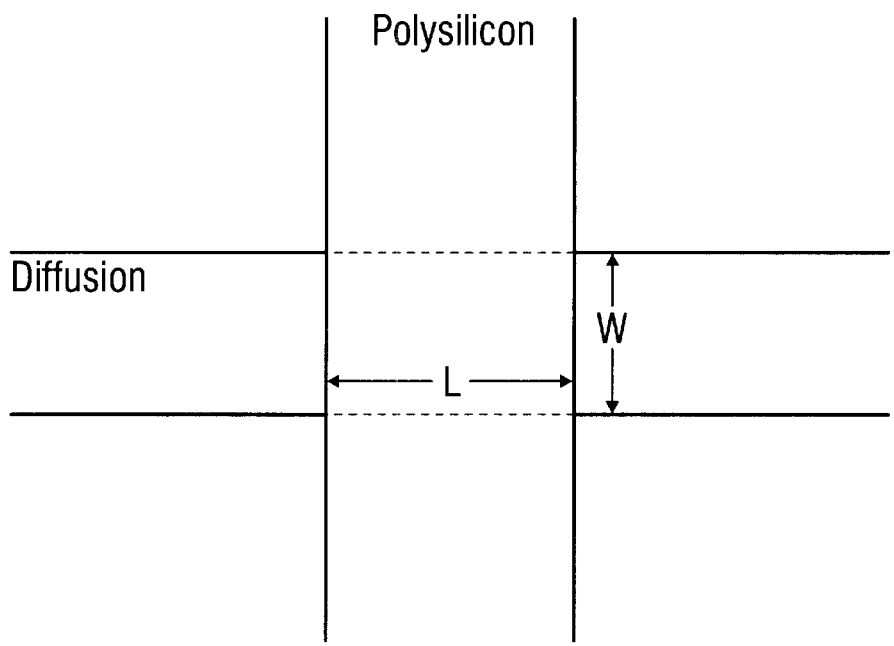
FIG. 6 shows design parameters for the drive transistors in the preferred embodiment.

FIGS. 5 and 6 show corresponding designs for pass and drive transistors that balance leakage by design of the dimensions of W and L for these transistors. FIG. 5 shows the design for the pass transistors 402, 404. Making the width larger than the length increases W/L for the pass transistors 402, 404 and thus increases both the subthreshold and the drive currents for these transistors. FIG. 6 shows an accompanying design for the drive transistors 406, 408, which must have a lower subthreshold voltage than the pass transistors 402, 404 to obtain standby stability. The drive transistors' 406, 408 channels have a lower W/L than the pass transistors 402, 404 in FIG. 5, and therefore a lower off-state current. These W/L ratios ensure that the leakage into and out of the storage node will be balanced at a detectable voltage. This innovative method of balancing the leakage currents does not require added process steps, and requires less standby current to maintain its data state.

Typically, the W/L ratios for both the pass and drive transistors are in the area of 0.25 micron/0.12 micron, yielding a cell beta ratio of one. In the preferred embodiment, standby stability is achieved by increasing the pass W/L relative to the drive W/L. One scheme widens the pass transistor by 25% (increasing the pass transistor W/L) and lengthens the drive transistor by up to 50% (decreasing the drive transistor W/L). Such a design therefore has pass gate dimensions of about 0.313 micron/0.12 micron (giving a pass W/L ratio of 2.6) and drive gate dimensions of 0.25 micron/0.18 micron (giving a drive W/L ratio of about 1.39). The cell beta for such a design is about 0.53. The increase in the drive gate length is particularly effective because of the impact of short channel effects on leakage current. However, there is a limit to the lengthening of the channel before reverse short channel effects cause a decrease in $V_T$ and an increase in leakage.

This design sacrifices read stability for standby stability. Referring again to FIG. 4, assume that node B is in a low potential state when read. The transistor 408 must pull its bitline low when the wordline opens the pass transistor 404. The bitline, which is precharged high in the preferred embodiment, will tend to pull node B high. If the drive transistor 408 is weak relative to the pass transistor 404, node B will be pulled high during the read (which may alter the data state of the cell) and the cell will require a write-back to ensure restoration of the original stored state.

Figure 1A:
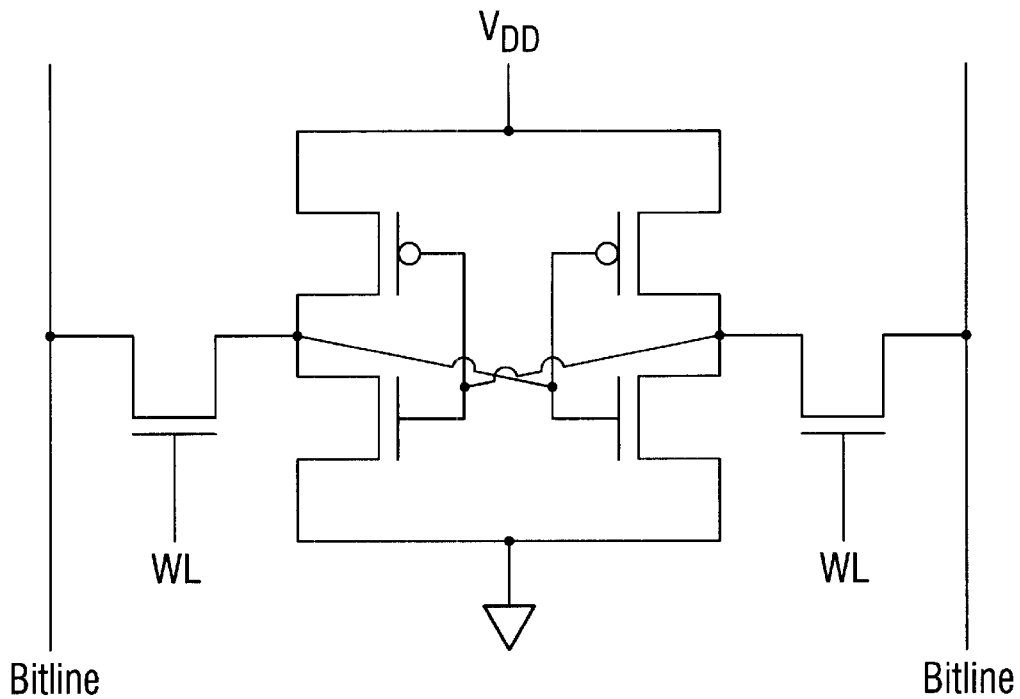
FIGS. 1a–1c show typical bistable flipflop storage cells—a 6T cell, a 4T-2R cell, and a 4T cell, respectively.
Figure 1B:
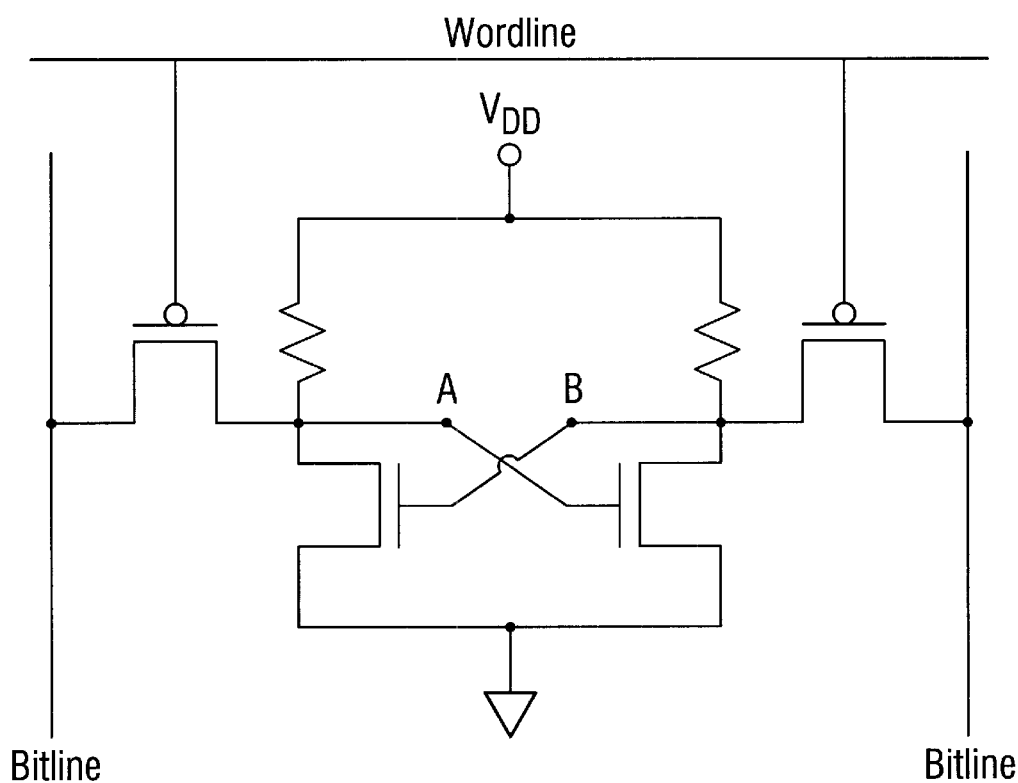
Figure 1C:
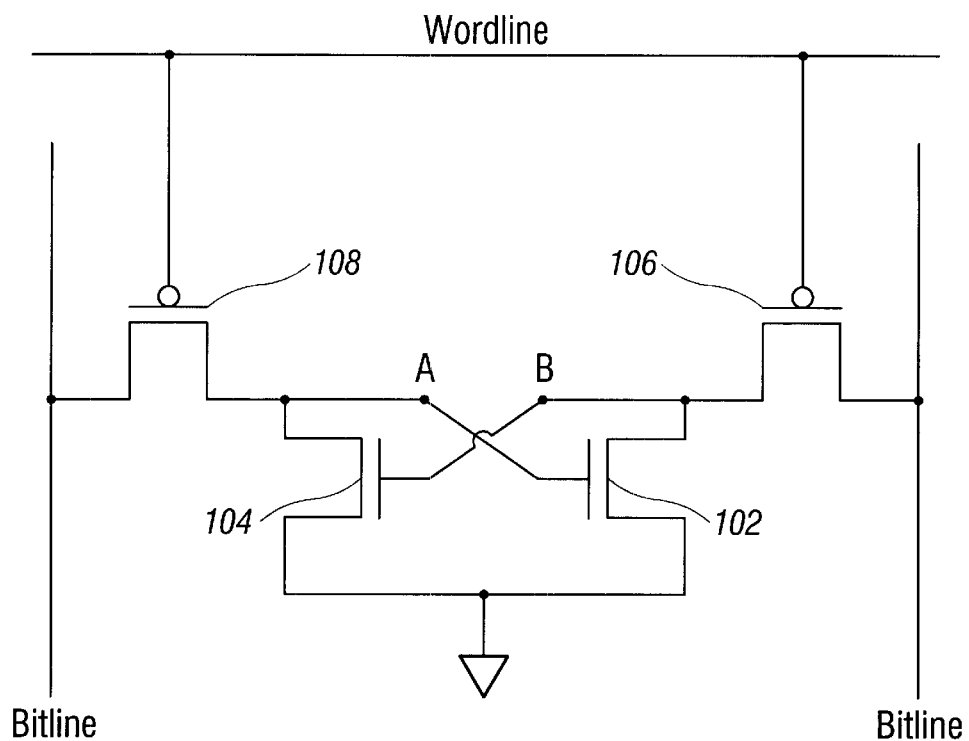
Figure 2:
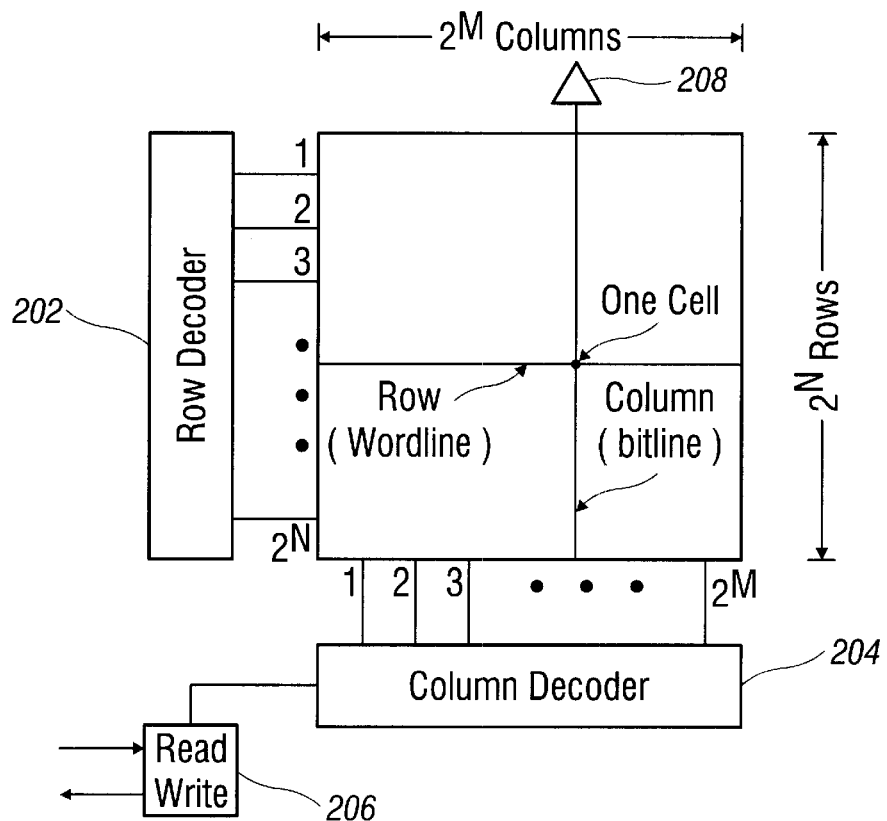
FIG. 2 shows a storage architecture for RAM.
Figure 3:
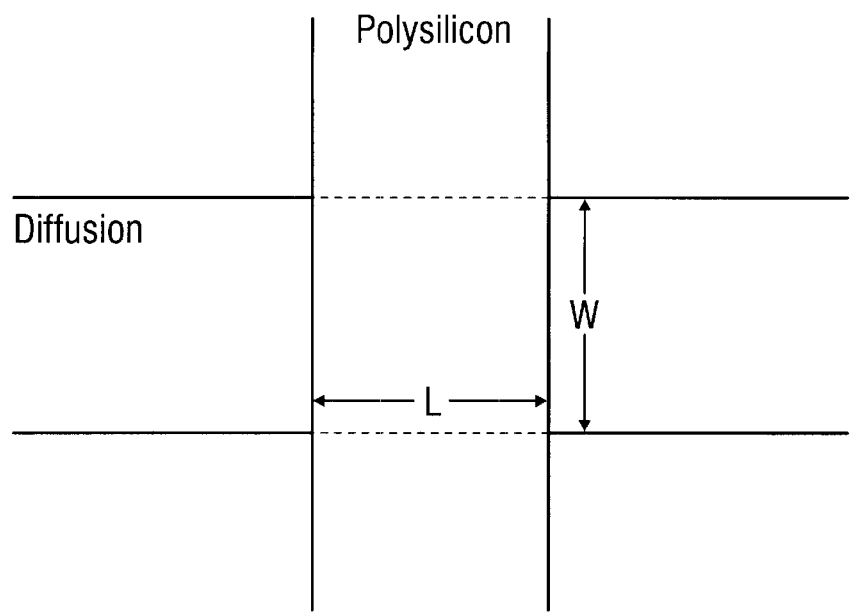
FIG. 3 shows the crossing of polysilicon and diffusion layers in a transistor.

Since the innovative memory cell is susceptible to upset on read, a write-back is implemented in the read cycle. Referring now to FIG. 2, when a particular memory cell is accessed, a sense amp 208 detects the voltage differential between that cell's bitlines. Note that all cells on the accessed wordline may be upset since all those cells' pass transistors are activated when the wordline is brought low (assuming p-channel pass transistors). Each data column has its own sense amp 208 which not only detects the voltage differential and routes the data out of the array, but also sends the respective voltage differential back to the relevant memory cell, restoring the state of the flipflop. This accomplishes the write-back, which preserves the states of the storage cells on read.

The writeback in the preferred embodiment is similar to that used in standard DRAM practice. The writeback is part of the read sequence timing chain. This sequence includes an address decode, enablement of the wordline, turning off of the bitline precharge (which can also be done before the wordline enable), enablement of the sense amp (which includes driving of the bitlines for the writeback), disablement of the wordline, and precharging of the bitline.

Each column has a sense amp. When a sense amp is enabled, it detects the differential voltage on the associated bitlines and amplifies this differential, driving the bitlines fully in the direction sensed. The selected wordline is maintained on while the bitlines are driven by the sense amp, which accomplishes the necessary writeback to the cell. The wordline is then turned off and the bitlines are precharge to a balanced condition. In a clocked environment, the entire read sequence (including writeback) can be triggered from a single clock edge. The sequence can thus be self-timed, or selected steps can be triggered by succeeding clock edges.

A more complex sequence can include separating the sense amp from the bitline at the time of enable. This would prevent the bitline capacitance from slowing sensing, but would require reconnecting the sense amp to the bitlines after sensing to accomplish the writeback.

Figure 7:
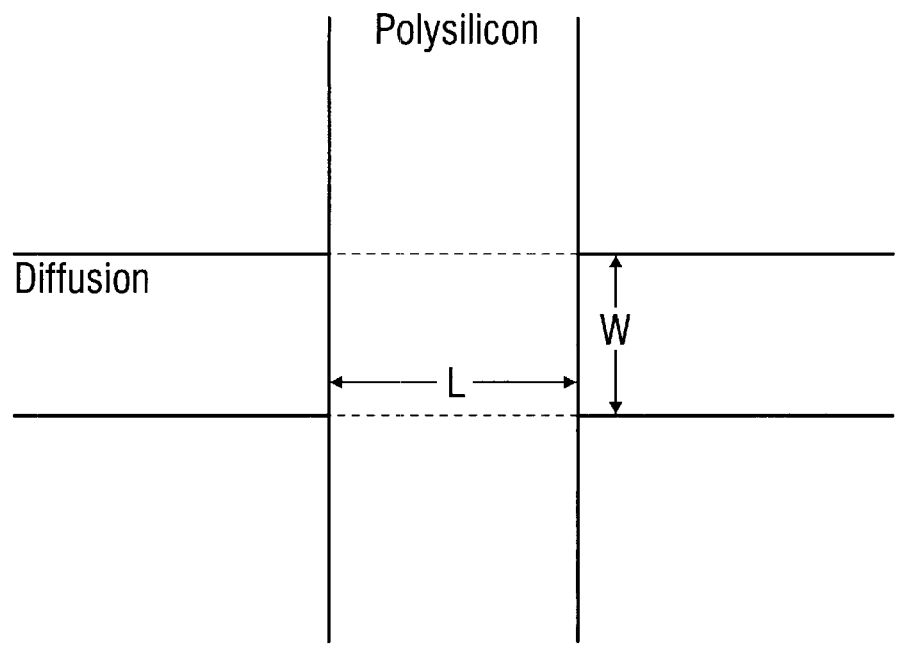
FIGS. 7 and 8 show alternative design parameters for the drive and pass transistors.
Figure 8:
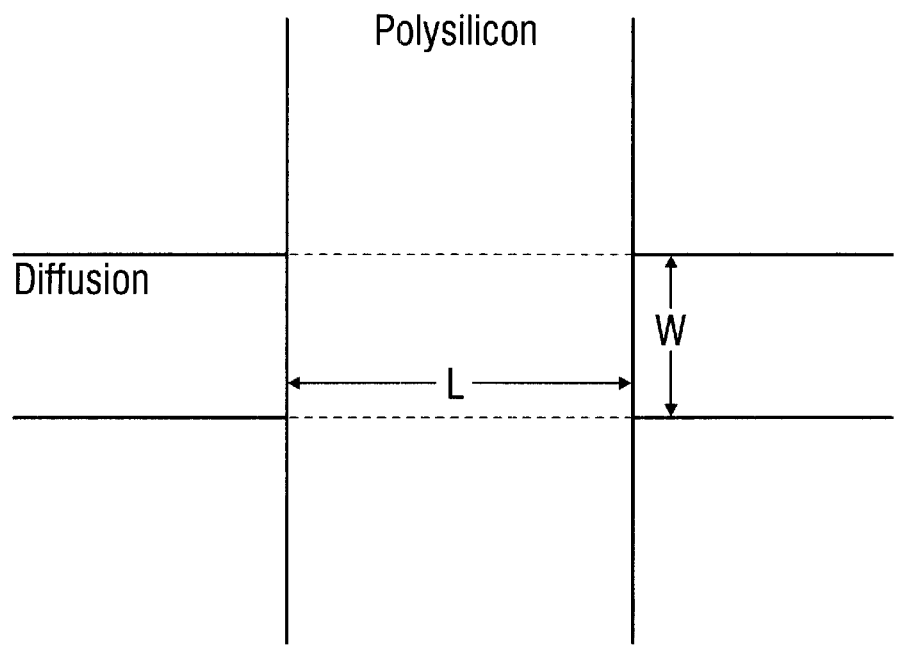

FIGS. 7 and 8 show an alternative design implementing the same innovative concepts. FIG. 7 shows the pass transistors 402, 404 with a moderate W to L ratio, and FIG. 8 shows a comparatively smaller ratio for the drive transistors 406, 408. This again results in larger subthreshold current for the pass transistors 402, 404 than the drive transistor 406, 408, yielding the desired standby stability.

Figure 9:
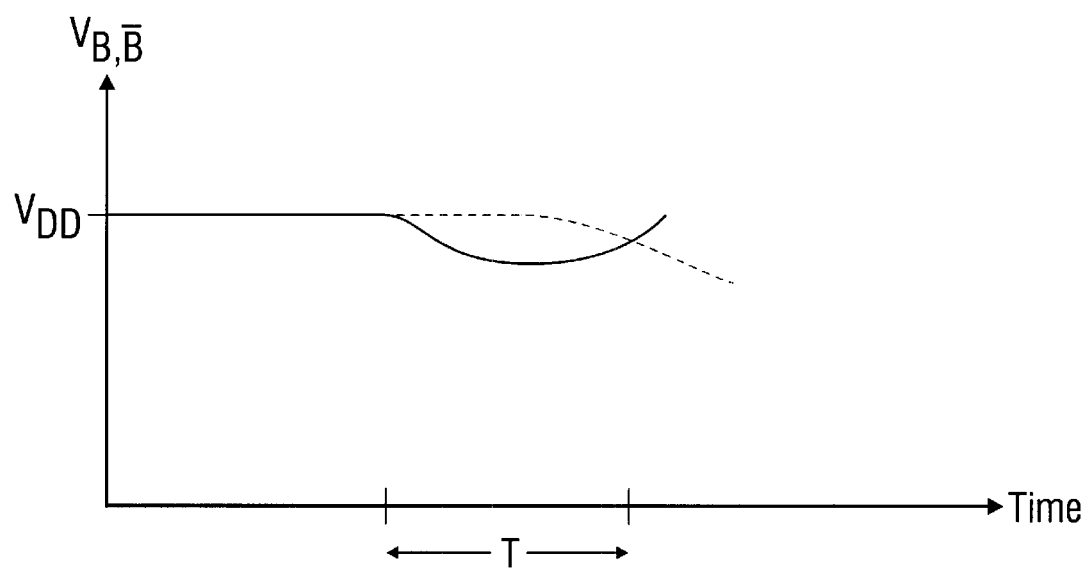
FIG. 9 shows a graph of the bitline responses that incorporates a write-back after cell upset.
Figure 10:
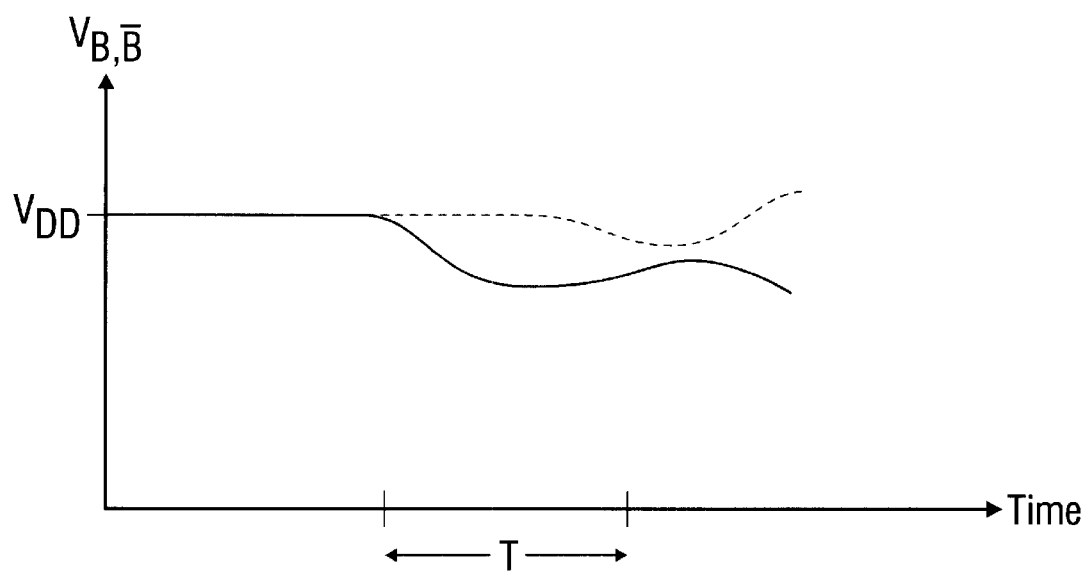
FIG. 10 shows a graph of the bitline responses that incorporates a write-back before cell upset.

FIGS. 9 and 10 show possible time frames for detecting the bitline voltage differential. FIG. 9 shows a graph with time on the horizontal axis and the bitline voltages (B is the solid line, B-bar is the dashed line). The two bitlines are initially charged to $V_{DD}$. When the wordline is activated, the two voltages diverge because of the difference in voltages at the storage nodes associated with each bitline. The time interval "T" shows when the correct data can be sensed because a detectable differential exists. When the lines cross, the cell has become upset (and no longer contains the previously stored state). In this case, the sense amp that detects the voltage differential has been disconnected from the bitlines (which speeds up sensing and reporting of the differential), and the cell is allowed to be upset. The writeback occurs just after the sense time.

FIG. 10 shows the same situation, except that a write-back has been implemented before cell has been upset on read. The sense amp maintains its connection with the bitlines, and the two voltages thus maintain their state.

Definitions:

Following are short definitions of the usual meanings of some of the technical terms which are used in the present application. (However, those of ordinary skill will recognize whether the context requires a different meaning.) Additional definitions can be found in the standard technical dictionaries and journals.

Noise Margin: The extraneous signal voltage amplitude that can be added to the noise-free worst case input level of a logic circuit before deviation of the allowable logic levels occurs.

Current Leakage: Current leakage, or leakage current, is current that escapes from the device by means other than that intended, such as through parasitic bipolar action.

N-channel: A channel of n-type semiconductor material induced in a FET as a result of a bias applied to the gate. This channel allows current to flow from the drain to the source of an NMOS transistor. Typically an N-type channel is formed by surface inversion of p-type material, but it may also be formed by surface enhancement of n-type material.

NMOS: An n-channel field effect transistor, or a circuit or chip containing this type of transistor.

Nonvolatile memory: A memory in which the stored data will remain for a very long time, even if the power supply is disconnected. Common types include EPROM, EEPROM, Flash, and battery-backed CMOS modules.

N-type: A volume of semiconductor which normally includes an excess of electrons. This can be achieved by introduction of "donor" dopants (such as phosphorus, arsenic, or antimony in silicon).

P-channel: A channel of p-type semiconductor material induced in a FET as a result of a bias applied to the gate. This channel allows carriers to flow from the source to the drain of a PMOS transistor.

P-type: A volume of semiconductor which normally includes an excess of holes. This can be achieved by introduction of "acceptor" dopants (such as boron or gallium in silicon).

PMOS: A p-channel field effect transistor, or a circuit or chip containing this type of transistor.

Polysilicon: Polycrystalline silicon.

Threshold Voltage: The voltage at which a transistor starts to turn on.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

Additional general background, which helps to show the knowledge of those skilled in the art regarding variations and implementations, may be found in the following publications, all of which are hereby incorporated by reference: SEMICONDUCTOR MEMORIES, by Prince, INTRODUCTION TO VLSI SYSTEMS, by Mead and Conway, PHYSICS AND TECHNOLOGY OF SEMICONDUCTOR DEVICES, by Grove, USER'S GUIDEBOOK TO DIGITAL CMOS INTEGRATED CIRCUITS, by Hnatek.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

In one type of alternative embodiment, NMOS transistors are used for the pass transistors rather than PMOS. The gate lengths can still be manipulated to balance the leakage current.

In another class of embodiments, different numbers of transistors are used to store the data in the cell. Regardless of the number of transistors used, such a circuit is within the contemplation of the present invention if it implements the innovations of the present application.

Single bitline cells might also implement the innovations of the present application, as might multiple wordline architectures. Possible architectures include, but are not necessarily limited to, dual ports with double ended access (using four bitlines and two wordlines in an 8-T cell), content addressable cells (adding a match line to detect the state of the stored bit), 5-T CMOS with single access, and dual port with single-ended access.

What is claimed is:

1. A memory subsystem, comprising:
   a 4T memory cell consisting essentially of two pass transistors with a first W/L ratio and two drive transistors with a second W/L ratio wherein said first W/L ratio is greater than said second W/L ratio; and
   said 4T memory cell upsets on read.

2. The memory subsystem of claim 1 wherein first W/L ratio is at least 2.4 and said second W/L ratio is no more than 1.5.

3. The memory subsystem of claim 2 wherein said pass transistors are p-channel transistors and said drive transistors are n-channel transistors.

4. A method of operating a memory subsystem, comprising:
- providing a 4T memory cell consisting essentially of two pass transistors with a first W/L ratio and two drive transistors with a second W/L ratio wherein said first W/L ratio is greater than said second W/L ratio;
- performing a read operation which upsets voltage values existing on said 4T memory cell before said read operation; and
- performing a write back operation after said read operation wherein said voltage values existing on said 4T memory cell before said read operation are restored on said 4T memory cell.

5. A memory subsystem, comprising:
- a 4T memory cell consisting essentially of two pass transistors with a first leakage current and two drive transistors with a second leakage current wherein said first leakage current is greater than said second leakage current; and
- said 4T memory cell upsets on read.

6. The memory subsystem of claim 5 wherein said pass transistors are p-channel transistors and said drive transistors are n-channel transistors.

* * * * *